United States Patent
Yang et al.

(10) Patent No.: US 12,356,602 B2
(45) Date of Patent: Jul. 8, 2025

(54) MEMORY AND METHOD FOR PREPARING MEMORY

(71) Applicant: CHANGXIN MEMORY TECHNOLOGIES, INC., Hefei (CN)

(72) Inventors: Mengmeng Yang, Hefei (CN); Xiaojie Li, Hefei (CN); Xiaoling Wang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 572 days.

(21) Appl. No.: 17/668,701

(22) Filed: Feb. 10, 2022

(65) Prior Publication Data

US 2023/0010035 A1 Jan. 12, 2023

Related U.S. Application Data

(63) Continuation of application No. PCT/CN2021/121056, filed on Sep. 27, 2021.

(30) Foreign Application Priority Data

Jul. 8, 2021 (CN) .......................... 202110773760.6

(51) Int. Cl.
*H01L 27/108* (2006.01)
*H10B 12/00* (2023.01)

(52) U.S. Cl.
CPC .................... *H10B 12/01* (2023.02)

(58) Field of Classification Search
CPC ................ H10B 12/01; H01L 29/161; H01L 21/823807; H01L 21/823857; H01L 29/1054; H01L 29/66651; H01L 27/092
See application file for complete search history.

(56) References Cited

U.S. PATENT DOCUMENTS 6,891,192 B2   5/2005 Chen
7,291,528 B2   11/2007 Chen
(Continued)

FOREIGN PATENT DOCUMENTS

CN      1830092 A    9/2006
CN    101958322 A    1/2011
(Continued)

OTHER PUBLICATIONS

English translation of CN publication 101958322A (Year: 2011).*

*Primary Examiner* — Mohammed R Alam
(74) *Attorney, Agent, or Firm* — Syncoda LLC; Feng Ma

(57) ABSTRACT

A memory and a method for preparing a memory are provided. The method for preparing the memory includes: providing a substrate, in which the substrate includes a first N-type active region and a first P-type active region; forming an epitaxial layer covering the first P-type active region, in which the epitaxial layer exposes the first N-type active region; simultaneously forming a first gate dielectric layer covering the first N-type active region and a second gate dielectric layer covering the epitaxial layer, in which a thickness of the first gate dielectric layer is substantially the same as a thickness of the second gate dielectric layer; forming a first gate covering the first gate dielectric layer to form a first N-channel Metal Oxide Semiconductor (NMOS) device; and forming a second gate covering the second gate dielectric layer to form a first P-channel Metal Oxide Semiconductor (PMOS) device.

14 Claims, 10 Drawing Sheets

(56) References Cited

U.S. PATENT DOCUMENTS

| | | |
|---|---|---|
| 7,396,714 B2 | 7/2008 | Chen |
| 7,824,971 B2 | 11/2010 | Hwang |
| 8,274,102 B2 | 9/2012 | Hwang |
| 2005/0029601 A1 | 2/2005 | Chen |
| 2005/0158931 A1 | 7/2005 | Chen |
| 2007/0249114 A1 | 10/2007 | Chen |
| 2007/0287244 A1 | 12/2007 | Shen |
| 2009/0218604 A1 | 9/2009 | Hwang |
| 2011/0012207 A1 | 1/2011 | Hwang |
| 2013/0264653 A1* | 10/2013 | Cai .................. H01L 21/02532 257/E21.616 |

FOREIGN PATENT DOCUMENTS

| | | |
|---|---|---|
| CN | 102790052 A | 11/2012 |
| CN | 105826376 A | 8/2016 |
| CN | 111599762 A | 8/2020 |

\* cited by examiner

MEMORY AND METHOD FOR PREPARING MEMORY

CROSS-REFERENCE TO RELATED APPLICATIONS

This is a continuation application of International Patent Application No. PCT/CN2021/121056, filed on Sep. 27, 2021, which claims priority to Chinese Patent Application No. 202110773760.6 filed on Jul. 8, 2021 and entitled "MEMORY AND METHOD FOR PREPARING MEMORY". The disclosures of International Patent Application No. PCT/CN2021/121056 and Chinese Patent Application No. 202110773760.6 are incorporated by reference herein in their entireties.

TECHNICAL FIELD

Embodiments of the disclosure relate to the field of semiconductor technology, and relate to, but are not limited to, a memory and a method for preparing a memory.

BACKGROUND

In the existing Dynamic Random Access Memory (DRAM), silicon dioxide ($SiO_2$) is used as a dielectric in a power transistor. However, as the size of the DRAM continues to reduce, a concept of a High-K Metal Gate (HKMG) is introduced to solve the leakage problem of $SiO_2$, so as to further reduce the size of the DRAM device. After the HKMG is introduced, how to further improve device performance becomes an urgent problem to be solved.

SUMMARY

In view of this, embodiments of the disclosure provide a memory and a method for preparing a memory.

In a first aspect, an embodiment of the disclosure provides a method for preparing a memory, which includes the following operations.

A substrate is provided, in which the substrate includes a first N-type active region and a first P-type active region.

An epitaxial layer covering the first P-type active region is formed, in which the epitaxial layer exposes the first N-type active region.

A first gate dielectric layer covering the first N-type active region and a second gate dielectric layer covering the epitaxial layer are simultaneously formed, in which a thickness of the first gate dielectric layer is substantially the same as a thickness of the second gate dielectric layer.

A first gate covering the first gate dielectric layer is formed to form a first N-channel Metal Oxide Semiconductor (NMOS) device; and a second gate covering the second gate dielectric layer is formed to form a first P-channel Metal Oxide Semiconductor (PMOS) device.

In a second aspect, an embodiment of the disclosure provides a memory. The memory includes at least a substrate and a control circuit. The control circuit includes:
  a first N-channel Metal Oxide Semiconductor (NMOS) device including a first N-type active region, a first gate dielectric layer and a first gate, in which the first N-type active region is arranged in the substrate, and the first gate dielectric layer is arranged between the first N-type active region and the first gate; and
  a first P-channel Metal Oxide Semiconductor (PMOS) device including a first P-type active region, an epitaxial layer, a second gate dielectric layer and a second gate, in which the first P-type active region is arranged in the substrate, the epitaxial layer is arranged between the first P-type active region and the second gate dielectric layer, and a thickness of the second gate dielectric layer is substantially the same as a thickness of the first gate dielectric layer.

BRIEF DESCRIPTION OF THE DRAWINGS

In the accompanying drawings (which are not necessarily drawn to scale), similar reference numerals may denote similar components in different diagrams. The similar reference numerals having different letter suffixes may denote different examples of the similar components. The accompanying drawings generally illustrate various embodiments discussed in the disclosure by way of example and not by way of limitation.

DETAILED DESCRIPTION

To make the objectives, technical solutions, and advantages of the embodiments of the disclosure apparent, the specific technical solutions of the embodiments of the disclosure are further described below in detail with reference to the accompanying drawings in the embodiments of the disclosure. The following embodiments are used to describe the disclosure, but are not intended to limit the scope of the disclosure.

Currently, a growth method for forming a SiGe epitaxial layer in a P-type power transistor in the related art is shown in FIG. 1A to FIG. 1F.

Figure 1A:
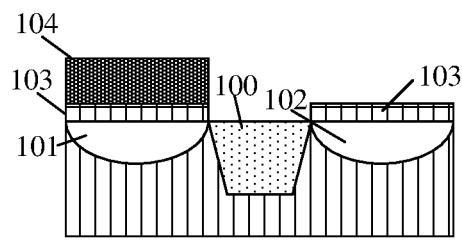
FIG. 1A to FIG. 1F are schematic diagrams showing formation of an epitaxial layer in the related art.
Figure 1B:
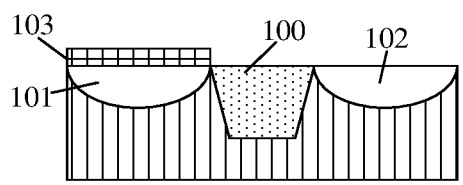

Firstly, as shown in FIG. 1A and FIG. 1B, a substrate is provided with an N-type active region 101 and a P-type active region 102. An isolation structure 100 is provided between the N-type active region 101 and the P-type active region 102. The N-type active region 101 and the P-type active region 102 are covered by oxide layers 103, so as to form a photoresist layer 104 covering a portion of the oxide layers 103. A photolithography technology is used to form a hole on a portion of the oxide layers 103 which is not covered by the photoresist layer 104, and the portion of the oxide layers 103 which is not covered by the photoresist layer 104 is removed until an upper surface of the P-type active region 102 is exposed.

Herein, the active region refers to a region in the substrate in which an active device is formed. The N-type active region refers to an active region which is doped with a pentavalent impurity element to form an N well, and the P-type active region refers to an active region which is doped with a trivalent impurity element to form a P well. A source, a drain and a channel region are provided in each of the N-type active region and the P-type active region.

In some embodiments, the isolation structure between the N-type active region and the P-type active region is configured to prevent the current between the N-type active region and the P-type active region from causing short circuit of the transistor. In some embodiments, a constituent material of the isolation structure may be silicon dioxide or silicon nitride.

Figure 1C:
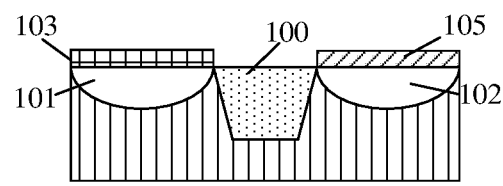
Figure 1D:
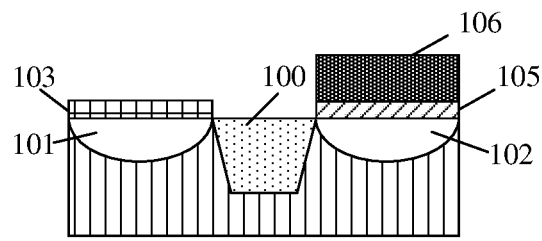
Figure 1E:
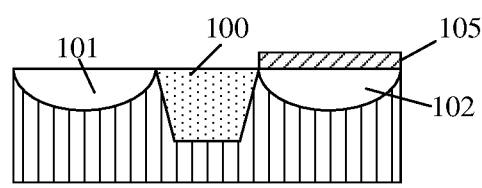

Secondly, an epitaxial layer 105 is formed on the exposed upper surface of P-type active region 102 through an epitaxial growth technology, as shown in FIG. 1C. In some embodiments, the epitaxial layer 105 may be a silicon germanium (SiGe) epitaxial layer. Then, a photoresist layer 106 covering the epitaxial layer 105 is formed, and a remaining portion of the oxide layers 103 is removed through a photolithography technology, until an upper surface of the N-type active region 101 is exposed, as shown in FIG. 1D and FIG. 1E.

Figure 1F:
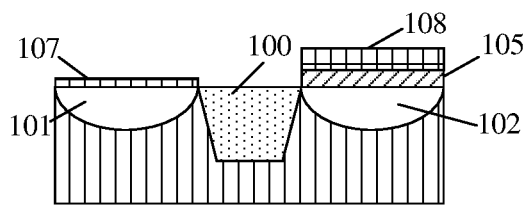

Finally, a first gate dielectric layer 107 covering the N-type active region 101 and a second gate dielectric layer 108 covering the epitaxial layer 105 are formed, as shown in FIG. 1F. However, since the composition of the N-type active region 101 is different from that of the epitaxial layer 105, and the epitaxial layer is easier to be oxidized, the oxidation rate of the N-type active region 101 is different from the oxidation rate of the epitaxial layer 105 under the same condition, so that the thickness of the first gate dielectric layer 107 is different from the thickness of the second gate dielectric layer 108. The slight thickness difference may have a greater impact on device performance.

Figure 2:
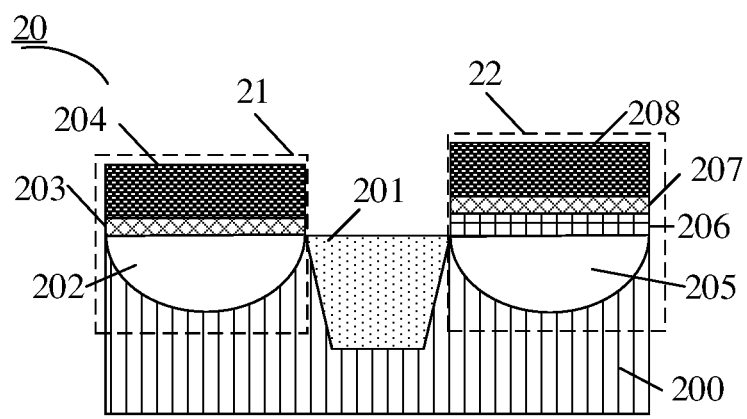
FIG. 2 is an optional schematic diagram of a memory according to an embodiment of the disclosure.

In view of the problem in the related art, the embodiments of the disclosure provide a memory and a method for preparing a memory. FIG. 2 is an optional schematic diagram of a memory according to an embodiment of the disclosure. As shown in FIG. 2, the memory 20 includes a substrate 200 and a control circuit. The control circuit includes:

a first N-channel Metal Oxide Semiconductor (NMOS) device 21 including a first N-type active region 202, a first gate dielectric layer 203 and a first gate 204, in which the first N-type active region 202 is arranged in the substrate 200, and the first gate dielectric layer 203 is arranged between the first N-type active region 202 and the first gate 204; and a first P-channel Metal Oxide Semiconductor (PMOS) device 22 including a first P-type active region 205, an epitaxial layer 206, a second gate dielectric layer 207 and a second gate 208, in which the first P-type active region 205 is arranged in the substrate 200, the epitaxial layer 206 is arranged between the first P-type active region 205 and the second gate dielectric layer 207, and a thickness of the second gate dielectric layer 207 is substantially the same as a thickness of the first gate dielectric layer 203. In some embodiments, the memory 20 further includes an isolation structure 201. The isolation structure 201 is arranged between the first N-type active region 202 and the first P-type active region 205.

In the embodiments of the disclosure, the epitaxial layer covering the first P-type active region is formed on the substrate, and a gate dielectric layer with the same thickness is formed on a surface of each of the epitaxial layer and the first N-type active region. In this way, the thickness of the gate dielectric layer on the surface of the first P-type active region is substantially the same as the thickness of the gate dielectric layer on the surface of the first N-type active region, so that the performance of the memory is improved, and the performance of the memory is more stable.

The memory provided in the embodiment of the disclosure may be formed by the method for preparing the memory provided in the following embodiments.

Figure 3:
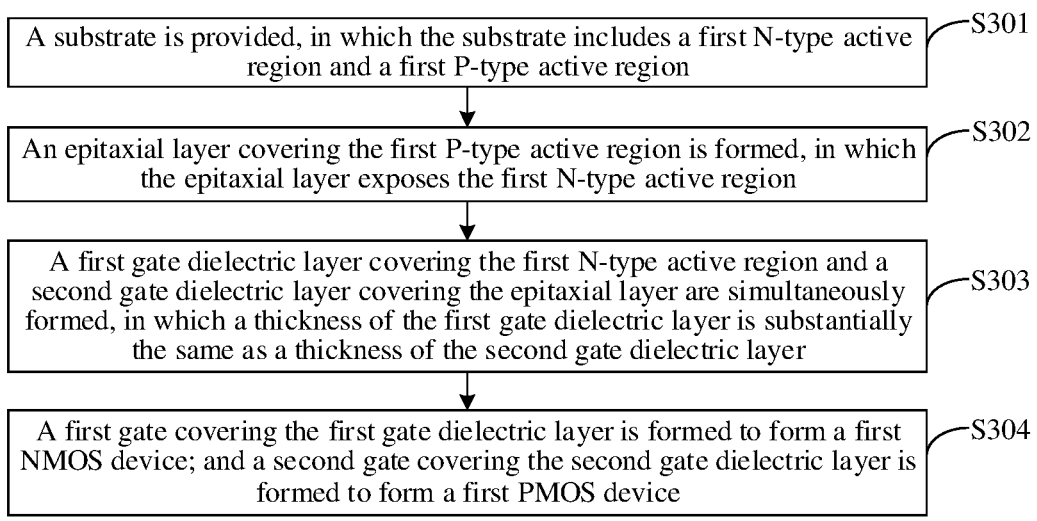
FIG. 3 is an optional schematic flowchart of a method for preparing a memory according to an embodiment of the disclosure.

FIG. 3 is an optional schematic flowchart of a method for preparing a memory according to an embodiment of the disclosure. As shown in FIG. 3, the method for preparing the memory includes the following operations.

In S301, a substrate is provided, in which the substrate includes a first N-type active region and a first P-type active region.

In S302, an epitaxial layer covering the first P-type active region is formed, in which the epitaxial layer exposes the first N-type active region.

In S303, a first gate dielectric layer covering the first N-type active region and a second gate dielectric layer covering the epitaxial layer are simultaneously formed, in which a thickness of the first gate dielectric layer is substantially the same as a thickness of the second gate dielectric layer.

In S304, a first gate covering the first gate dielectric layer is formed to form a first NMOS device; and a second gate covering the second gate dielectric layer is formed to form a first PMOS device.

Hereinafter, referring to FIG. 8A to FIG. 8L, the method for preparing the memory provided in the embodiment of the disclosure is further described in detail.

Figure 8A:
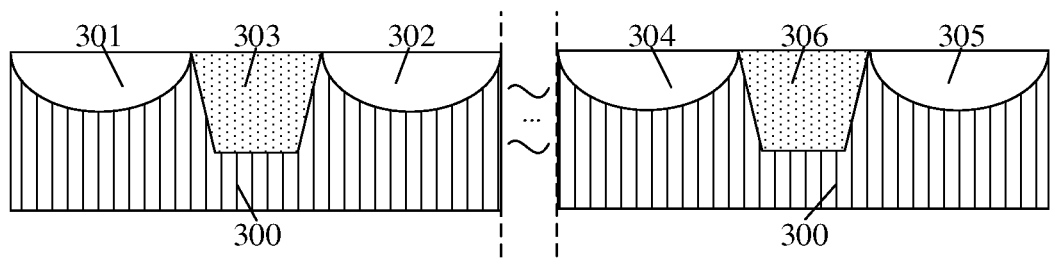
FIG. 8A to FIG. 8L are optional schematic diagrams of a method for preparing a memory according to an embodiment of the disclosure.

Hereinafter, referring to FIG. 8A, S301 is performed, in which a substrate 300 is provided. The substrate 300 includes a first N-type active region 301 and a first P-type active region 302, and a first isolation structure 303 is provided between the first N-type active region 301 and the first P-type active region 302. In some embodiments, the memory further includes an interface circuit. The interface circuit includes a second NMOS device and a second PMOS device. A second N-type active region 304 of the second NMOS device and a second P-type active region 305 of the second PMOS device are arranged in the substrate 300, and a second isolation structure 306 is provided between the second N-type active region 304 and the second P-type active region 305.

In some embodiments, a material of the substrate may be silicon, silicon nitride or gallium nitride.

In some embodiments, there are other structures between the storage array and the interface circuit in the memory, which are not illustrated in the accompanying drawings provided in the embodiments of the disclosure.

Hereinafter, referring to FIG. 8B and FIG. 8H, S302 is performed, in which the epitaxial layer covering the first P-type active region is formed. The epitaxial layer exposes the first N-type active region.

Figure 4:
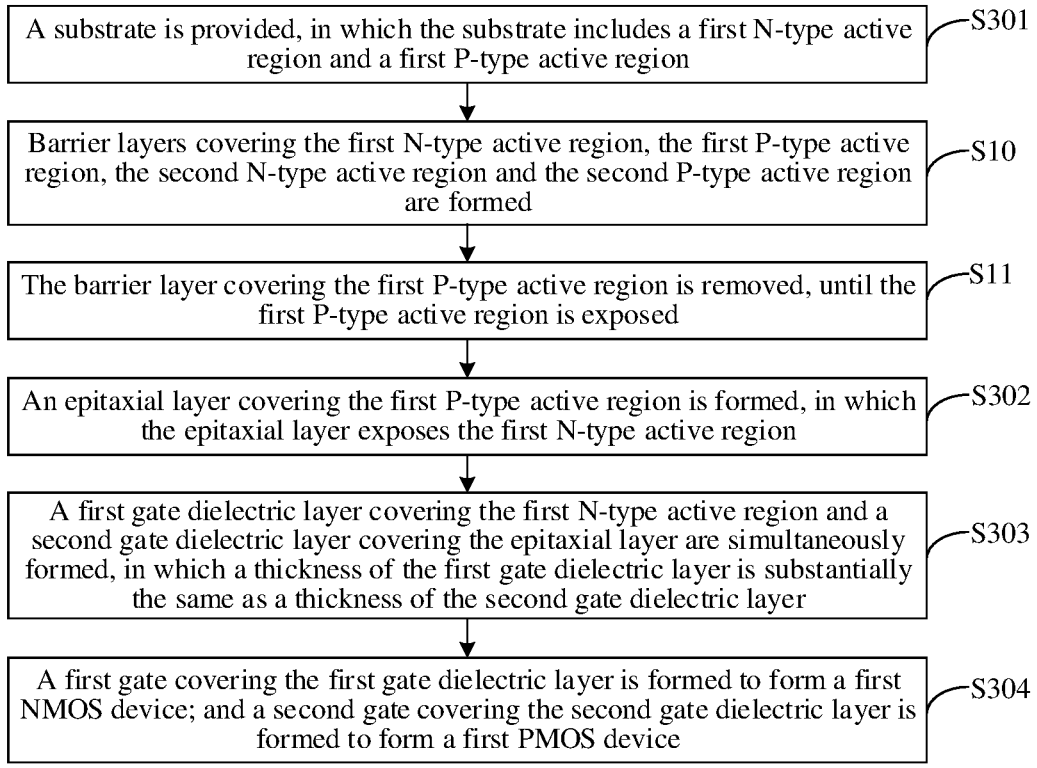
FIG. 4 is an optional schematic flowchart of a method for preparing a memory according to an embodiment of the disclosure.

In some embodiments, before S302 is performed, the first P-type active region needs to be exposed. FIG. 4 is an optional schematic flowchart of a method for preparing a memory according to an embodiment of the disclosure. As shown in FIG. 4, the method for preparing the memory further includes the following operations.

In S10, barrier layers covering the first N-type active region, the first P-type active region, the second N-type active region and the second P-type active region are formed.

Figure 8B:
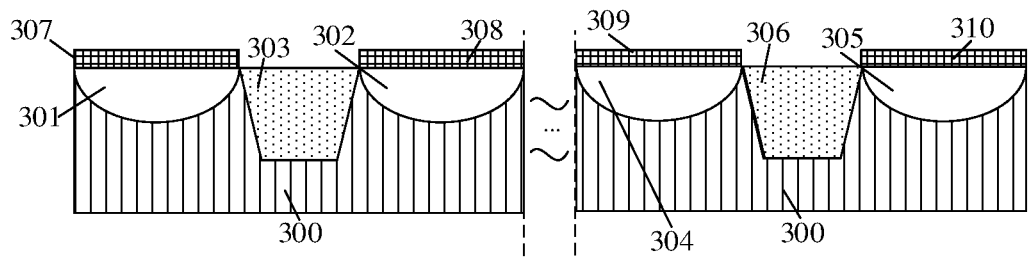

FIG. 8B is a schematic diagram showing formation of barrier layers according to an embodiment of the disclosure. As shown in FIG. 8B, a barrier layer 307 covering the first N-type active region 301, a barrier layer 308 covering the first P-type active region 302, a barrier layer 309 covering the second N-type active region 304, and a barrier layer 310 covering the second P-type active region 305 are formed.

In some embodiments, the barrier layers may be formed through an in-situ thermal growth process. The barrier layers are configured to protect structures below the barrier layers from being affected by an etching or deposition process.

In some embodiments, a material of the barrier layer includes, but is not limited to, any one of silicon nitride, silicon oxynitride, silicon carbide, or silicon dioxide.

In S11, the barrier layer covering the first P-type active region is removed, until the first P-type active region is exposed.

Figure 8C:
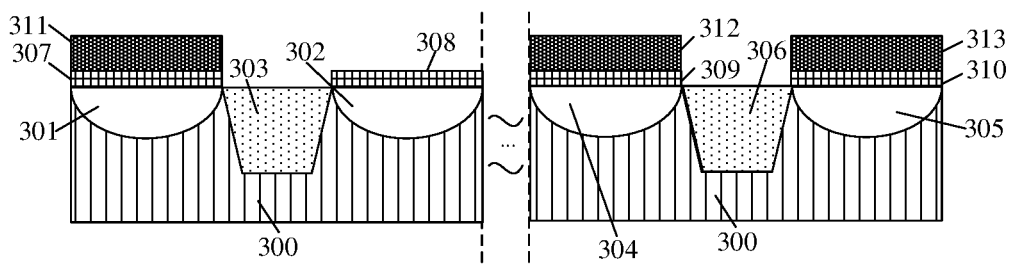
Figure 8D:
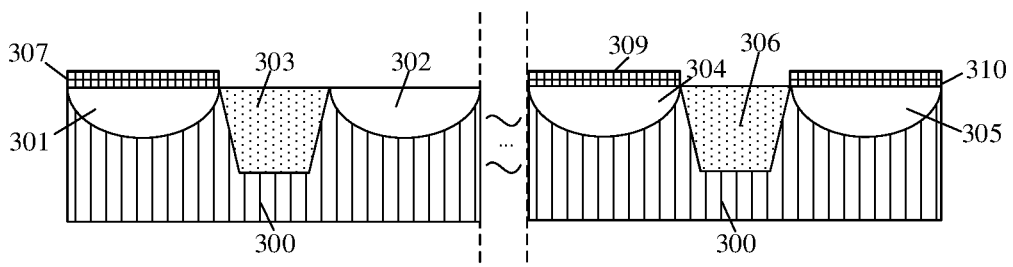

FIG. 8C and FIG. 8D are schematic diagrams showing removal of barrier layers according to an embodiment of the disclosure. As shown in FIG. 8C and FIG. 8D, a photoresist layer 311 covering the barrier layer 307, a photoresist layer 312 covering the barrier layer 309, a photoresist layer 313 covering the barrier layer 310 are formed, and the barrier layer 308 covering the first P-type active region 302 is etched until the first P-type active region 302 is exposed, and the photoresist layer 311, the photoresist layer 312 and the photoresist layer 313 are removed.

In some embodiments, the barrier layers may be etched through a dry etching process, such as a plasma etching process or a reactive ion etching process.

In some embodiments, after the barrier layer covering the first P-type active region is removed, S302 is performed, in which the epitaxial layer covering the first P-type active region is formed.

Figure 8E:
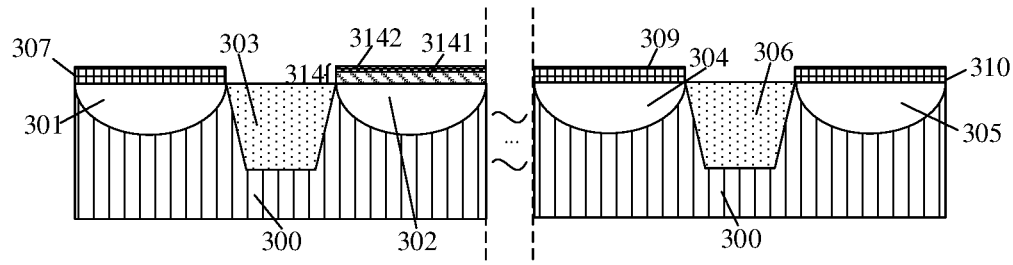

FIG. 8E is an optional schematic diagram showing formation of an epitaxial layer according to an embodiment of the disclosure. As shown in FIG. 8E, the epitaxial layer 314 covering the first P-type active region 302 is formed.

Figure 5:
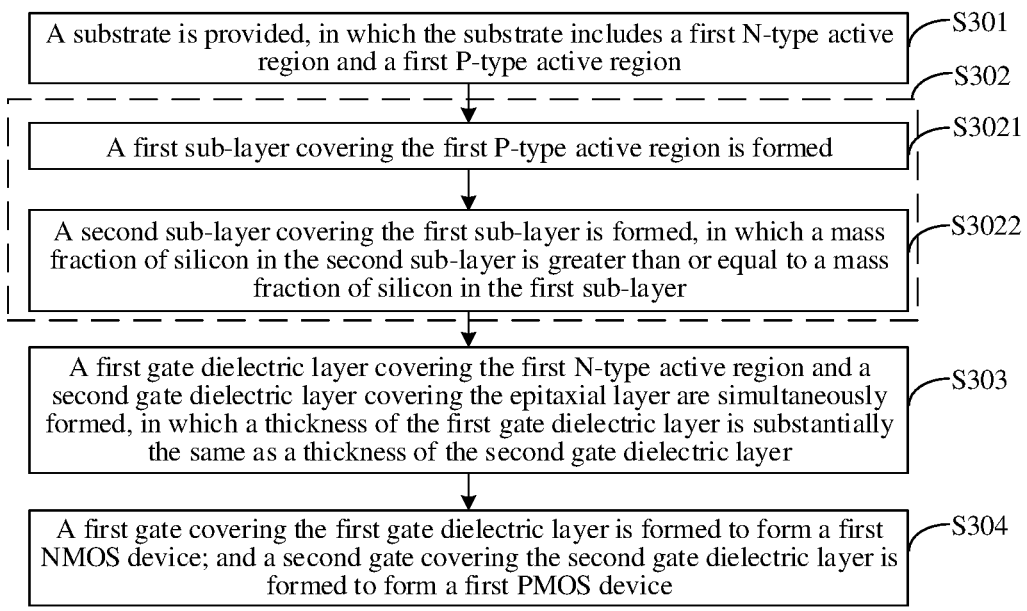
FIG. 5 is an optional schematic flowchart of a method for preparing a memory according to an embodiment of the disclosure.

In some embodiments, the epitaxial layer 314 includes at least a first sub-layer 3141 and a second sub-layer 3142. FIG. 5 is an optional schematic flowchart of a method for preparing a memory according to an embodiment of the disclosure. As shown in FIG. 5, S302 may be implemented through the following operations.

In S3021, the first sub-layer covering the first P-type active region is formed.

In S3022, the second sub-layer covering the first sub-layer is formed, in which a mass fraction of silicon in the second sub-layer is greater than or equal to a mass fraction of silicon in the first sub-layer.

In some embodiments, a constituent material of the first sub-layer may include silicon and germanium.

In some embodiments, the epitaxial layer may be formed through a vapor phase epitaxy process. The reaction gases are supplied into the substrate. The reaction gases undergo a high-temperature chemical reaction in a reaction chamber, so that the reaction gases are reduced or thermally decomposed, and the generated atoms are epitaxially grown on the surface of the substrate.

In some embodiments, a first reaction gas may be silane ($SiH_4$), and a second reaction gas may be germane ($GeH_4$). When the chemical reaction occurs, some auxiliary gases are further needed to adjust the growth position of the epitaxial layer or to form a protective gas. The auxiliary gas may be a mixed gas composed of hydrogen ($H_2$) with silicon tetrachloride ($SiCl_4$), trichlorosilane ($SiHCl_3$), silane ($SiH_4$), or dichlorosilane ($SiH_2Cl_2$). The first reaction gas containing silicon and the second reaction gas containing germanium are reduced or thermally decomposed, so that the generated silicon atoms and germanium atoms are epitaxially grown on the surface of the substrate, so as to form the first sub-layer.

Figure 11:
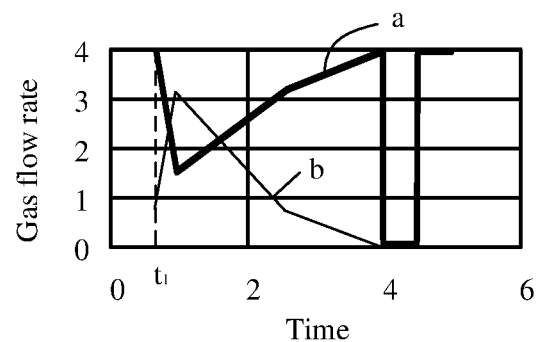
FIG. 11 is an optional schematic diagram showing a relationship between a gas flow rate and time for forming a first sub-layer according to an embodiment of the disclosure.

FIG. 11 is an optional schematic diagram of a gas flow rate at which a first sub-layer is formed according to an embodiment of the disclosure. As shown in FIG. 11, a first reaction gas containing silicon and a second reaction gas containing germanium are supplied to the surface of the substrate. A flow rate curve of the first reaction gas is shown as the curve a in FIG. 11, and a flow rate curve of the second reaction gas is shown as the curve b in FIG. 11. The first reaction gas chemically reacts with the second reaction gas, so as to form at least a portion of the first sub-layer. After the first reaction gas and the second reaction gas are supplied for a first preset time period ti, a gas flow rate of the first reaction gas is decreased from a first flow rate to a second flow rate, and/or a gas flow rate of the second reaction gas is increased from a third flow rate to a fourth flow rate, so as to form the first sub-layer.

In some embodiments, when a portion of the first sub-layer on the surface of the substrate is formed, the gas flow rate of the first reaction gas containing silicon is much greater than the gas flow rate of the second reaction gas containing germanium for the following reason. An atomic radius of a silicon substrate is the same as an atomic radius of a silicon atom, and the silicon atoms generated by chemical reaction of the first reaction gas containing silicon may be fitted to the lattice growth method of the silicon substrate. In this case, firstly, one or more silicon epitaxial layers may be grown on the silicon substrate, and then the germanium atoms are gradually doped during the growth of the epitaxial layer. The germanium atom has a larger radius than the silicon atom. It is difficult to find a fitting site for the combination of the germanium atoms and the silicon atoms in the substrate, resulting in a relatively low growth rate of the epitaxial layer. Therefore, according to the embodiments of the disclosure, during the growth of the silicon epitaxial layer, the fitting sites for the germanium atoms are continuously grown, so that the growth rate of the silicon germanium epitaxial layer is improved, so as to form the silicon germanium epitaxial layer, that is, the first sub-layer.

In some embodiments, a mass fraction of germanium in the first sub-layer gradiently changes in a direction perpendicular to the substrate. In the embodiments of the disclosure, the mass fraction of germanium in the first sub-layer gradiently changes, so that an interface between the first sub-layer and the substrate, and an interface between the first sub-layer and the second sub-layer are stable, thereby improving the performance of the memory.

In some embodiments, the gas flow rate of the first reaction gas containing silicon and the gas flow rate of the second reaction gas containing germanium are constantly adjusted, so that the epitaxial layer has different germanium atomic concentrations in the direction perpendicular to the substrate. The embodiments of the disclosure exemplarily provide only two types of epitaxial layer structures, but the protection scope of the embodiments of the disclosure is not limited thereto.

Figure 6:
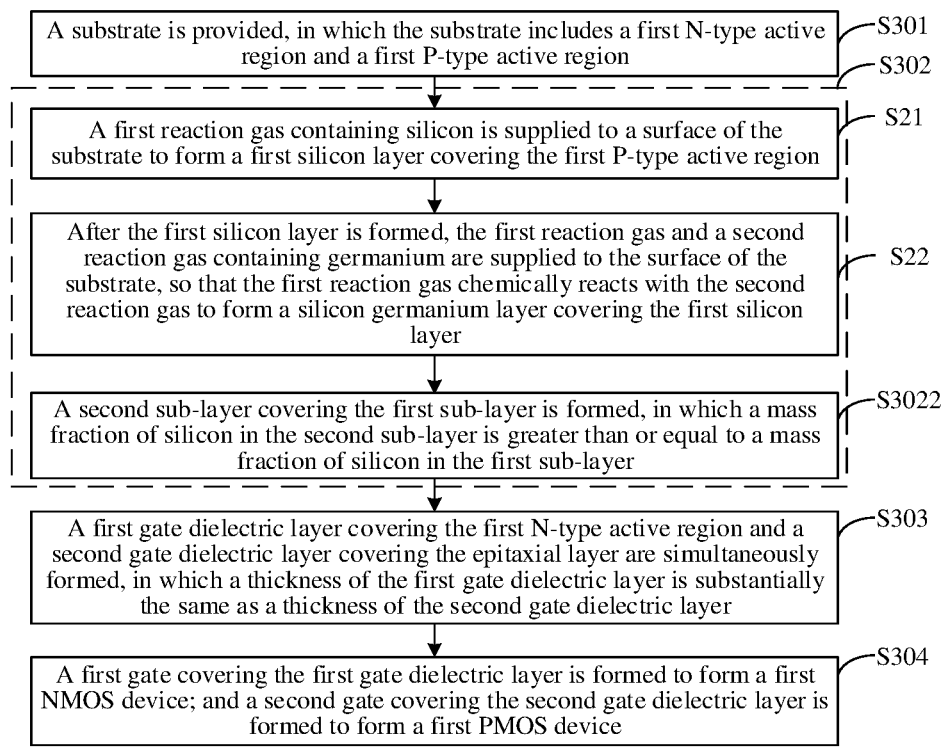
FIG. 6 is an optional schematic flowchart of a method for preparing a memory according to an embodiment of the disclosure.
Figure 8F:
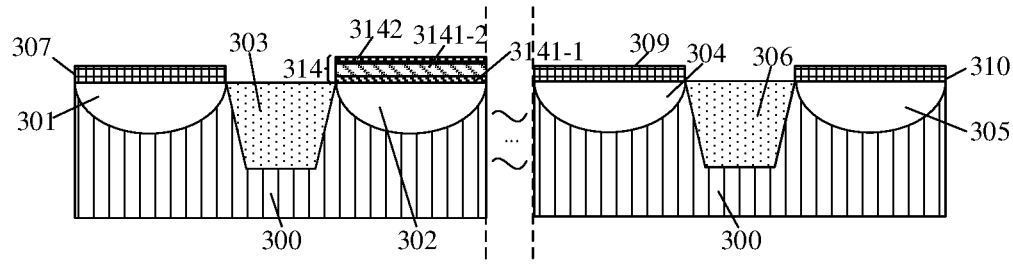

FIG. 8F is an optional schematic diagram showing formation of an epitaxial layer according to an embodiment of the disclosure. In some embodiments, as shown in FIG. 8F, the first sub-layer may further include a first silicon layer 3141-1 and a silicon germanium layer 3141-2. FIG. 6 is an optional schematic flowchart of a method for preparing a memory according to an embodiment of the disclosure. As shown in FIG. 6, the operation that the first sub-layer 3141 is formed may be implemented through the following operations.

In S21, a first reaction gas containing silicon is supplied to a surface of the substrate, so as to form the first silicon layer covering the first P-type active region.

Figure 12:
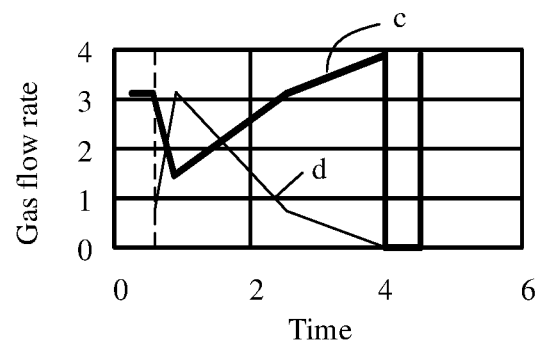
FIG. 12 is an optional schematic diagram showing a relationship between a gas flow rate and time for forming a first sub-layer according to an embodiment of the disclosure.

FIG. 12 is an optional schematic diagram of a gas flow rate at which a first sub-layer is formed according to an embodiment of the disclosure. As shown in FIG. 12, a flow rate curve of the first reaction gas is shown as the curve c in FIG. 12, and a flow rate curve of the second reaction gas is shown as the curve d in FIG. 12. In some embodiments, when the first silicon layer starts being formed, only the first reaction gas containing silicon is supplied to the surface of the first P-type active region 302, so that the first silicon layer 3141-1 covering the first P-type active region is formed on the surface of the first P-type active region 302.

Herein, a constituent material of the first silicon layer 3141-1 may be silicon.

In S22, after the first silicon layer is formed, the first reaction gas and a second reaction gas containing germanium are supplied to the surface of the substrate, so that the first reaction gas chemically reacts with the second reaction gas, so as to form the silicon germanium layer covering the first silicon layer.

In some embodiments, after the first silicon layer 3141-1 is formed, the first reaction gas containing silicon and the second reaction gas containing germanium are supplied to the surface of the first silicon layer, the gas flow rate of the first reaction gas is gradually decreased over time, and the gas flow rate of the second reaction gas is increased, so as to form the silicon germanium layer 3141-2 covering the first silicon layer 3141-1.

In some embodiments, the gas flow rate of the first reaction gas containing silicon and the gas flow rate of the second reaction gas containing germanium may be shown as the gas flow rate curves in FIG. 11 or FIG. 12. When the silicon germanium layer is formed, the gas flow rates of the first reaction gas and the second reaction gas may also remain unchanged. The gas flow rates of the first reaction gas and the second reaction gas may also be implemented in other manners, which are not limited in the embodiments of the disclosure.

In some embodiments, the silicon germanium layer is arranged between the first silicon layer and the second sub-layer.

In the embodiments of the disclosure, the first silicon layer is provided between the silicon germanium layer and the substrate, so that the epitaxial layer fits to an interface lattice in contact with the substrate, and thus the interface is more stable.

Referring to FIG. 8E and FIG. 8F, S3022 is performed, in which the second sub-layer 3142 covering the first sub-layer is formed after the first sub-layer 3141 is formed.

In some embodiments, after the first sub-layer 3141 is formed, the gas flow rates of the first reaction gas and the second reaction gas may be decreased to 0. And then the first reaction gas containing silicon is supplied to the surface of the first sub-layer 3141, so as to form the second sub-layer 3142 covering the first sub-layer.

In some embodiments, a surface of the second sub-layer 3142 away from the substrate is a second silicon layer (not shown in the figures). That is, a constituent material of the surface of the second sub-layer 3142 away from the substrate is silicon.

Hereinafter, referring to FIG. 8G to FIG. 8K, S303 is performed, in which a first gate dielectric layer covering the first N-type active region and the second gate dielectric layer covering the epitaxial layer are simultaneously formed.

Figure 7:
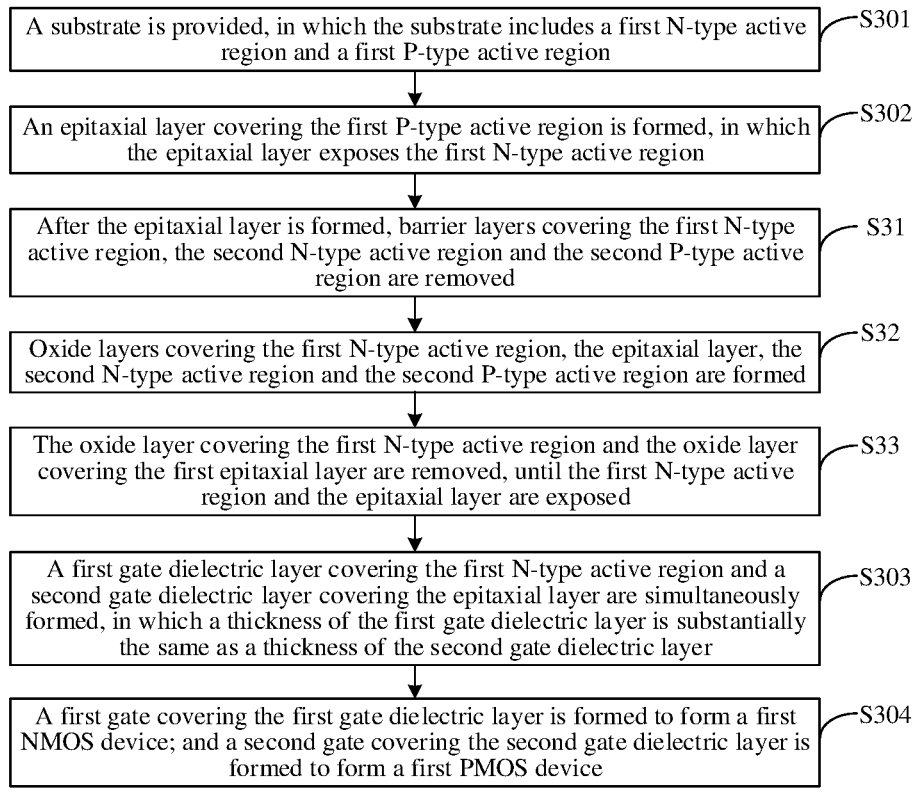
FIG. 7 is an optional schematic flowchart of a method for preparing a memory according to an embodiment of the disclosure.

In some embodiments, before the first gate dielectric layer and the second gate dielectric layer are formed, the barrier layer covering the first N-type active region is further needed to be removed. FIG. 7 is an optional schematic flowchart of a method for preparing a memory according to an embodiment of the disclosure. As shown in FIG. 7, the operation that the barrier layers are removed includes the following operations.

In S31, after the epitaxial layer is formed, the barrier layers covering the first N-type active region, the second N-type active region and the second P-type active region are removed.

Figure 8G:
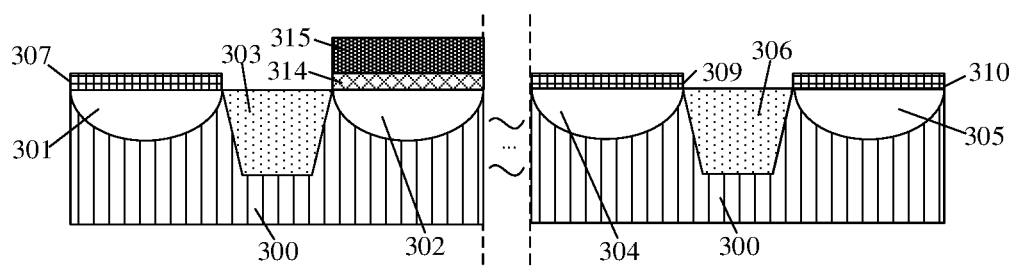
Figure 8H:
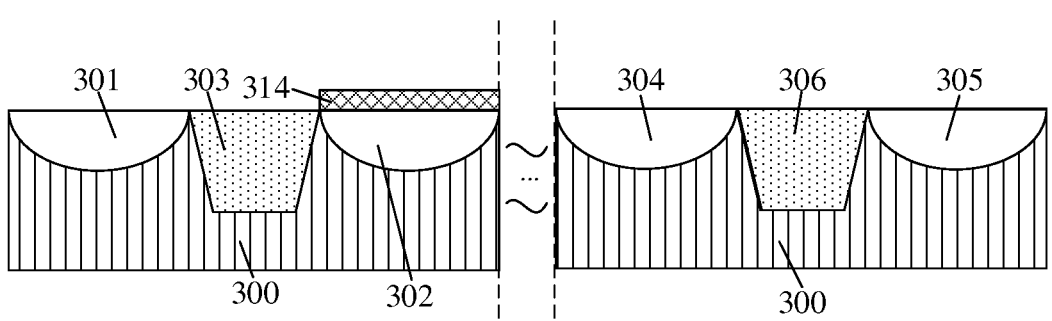

FIG. 8G and FIG. 8H are schematic diagrams showing removal of barrier layers according to an embodiment of the disclosure. As shown in FIG. 8G and FIG. 8H, a photoresist layer 315 covering the epitaxial layer 314 is formed. The barrier layer 307 covering the first N-type active region 301, the barrier layer 309 covering the second N-type active region 304, and the barrier layer 310 covering the second P-type active region 305 are removed by etching to expose the surface of the first N-type active region 301, the surface of the second N-type active region 304, and the surface of the second P-type active region 305, and then the photoresist layer 315 is removed.

In S32, oxide layers covering the first N-type active region, the epitaxial layer, the second N-type active region and the second P-type active region are formed.

Figure 8I:
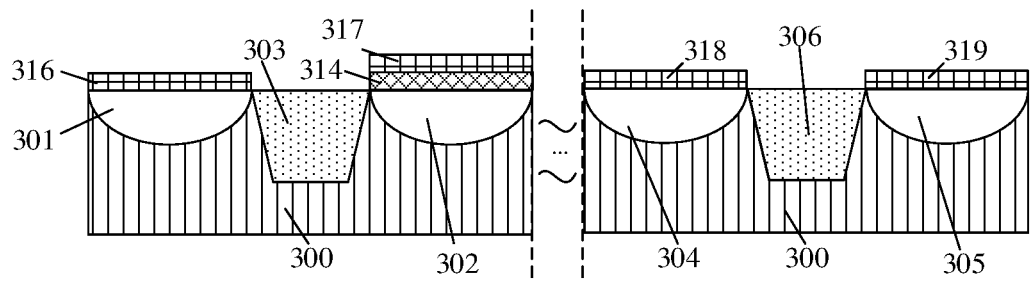

FIG. 8I is a schematic diagram showing formation of oxide layers according to an embodiment of the disclosure. As shown in FIG. 8I, the oxide layer 316 covering the first N-type active region 301, the oxide layer 317 covering the epitaxial layer 314, the oxide layer 318 covering the second N-type active region 304, and the oxide layer 319 covering the second P-type active region 305 are formed. The oxide layer 318 covering the second N-type active region forms a third gate dielectric layer of the second NMOS device, and the oxide layer 319 covering the second P-type active region forms a fourth gate dielectric layer of the second PMOS device.

In some embodiments, the oxide layer covering the epitaxial layer includes a first portion and a second portion. When the oxide layer covering the epitaxial layer is formed, since the constituent material of the surface of the second sub-layer of the epitaxial layer away from the substrate is silicon, when the oxide layer covering the epitaxial layer is formed, a portion of the second sub-layer, whose constituent material is silicon, is oxidized, so as to form the first portion of the oxide layer covering the epitaxial layer. The oxide layer covering the first N-type active region, the oxide layer covering the second N-type active region, and the oxide layer covering the second P-type active region are formed through a thermal oxidation process while the first portion is formed, and the second portion covering the first portion of the oxide layer is formed.

In some embodiments, the first portion of the oxide layer covering the epitaxial layer is arranged between a remaining portion of the epitaxial layer and the second portion.

In S33, the oxide layer covering the first N-type active region and oxide layer covering the epitaxial layer are removed, until the first N-type active region and the epitaxial layer are exposed.

Figure 8J:
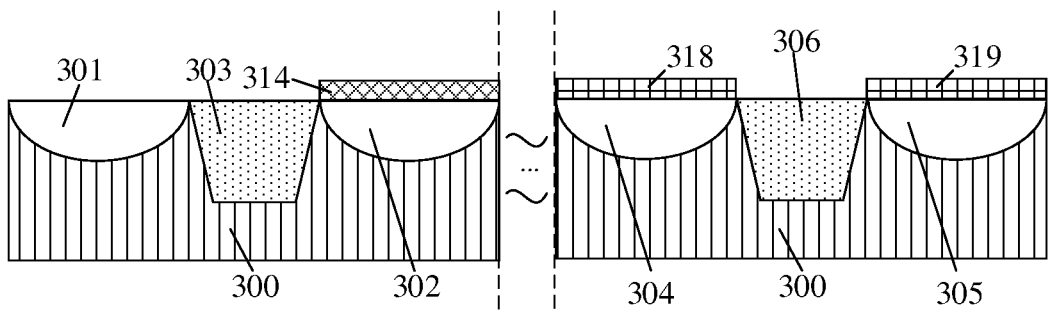

FIG. 8J is a schematic diagram showing removal of oxide layers according to an embodiment of the disclosure. As shown in FIG. 8J, photoresist layers (not shown in FIG. 8J) covering the third gate dielectric layer 318 and the fourth gate dielectric layer 319 are formed. The oxide layer 316 on the surface of the first N-type active region 301 and the oxide layer 317 on the surface of the epitaxial layer are removed through etching, and the photoresist layers are removed, so as to expose the surface of the first N-type active region 301 and the surface of the epitaxial layer 314.

Figure 8K:
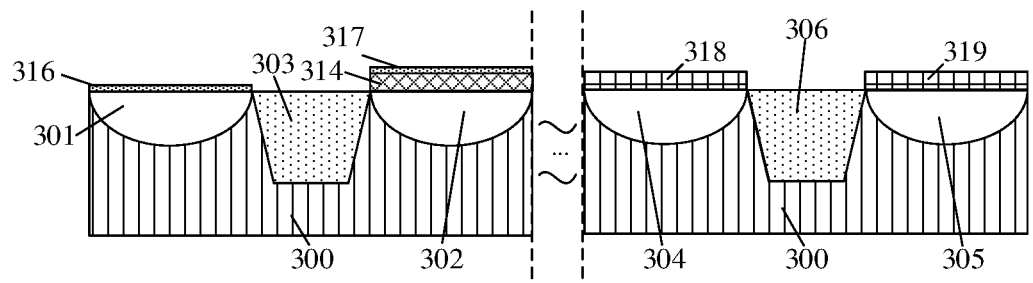

FIG. 8K is a schematic diagram showing formation of gate dielectric layers according to an embodiment of the disclosure. As shown in FIG. 8K, the first gate dielectric layer 316 covering the first N-type active region 301 and the second gate dielectric layer 317 covering the epitaxial layer 314 are simultaneously formed.

In some embodiments, since a constituent material of the surface of the epitaxial layer away from the substrate is pure silicon, the constituent material of the surface of the first N-type active region is the same as the constituent material of the surface of the epitaxial layer, and the oxidation rate at which the gate dielectric layer is formed on surface of the first N-type active region is the same as the oxidation rate at which the gate dielectric layer is formed on surface of the epitaxial layer, so that a thickness of the first gate dielectric layer 320 is the same as a thickness of the second gate dielectric layer 321.

In some embodiments, the gate dielectric layer may be formed through an in-situ thermal growth process. The gate dielectric layer may be a nitride (for example, silicon nitride or silicon oxynitride) or an oxide (for example, aluminum oxide or titanium oxide).

In the embodiments of the disclosure, the epitaxial layer is provided between the gate dielectric layer in the first PMOS device and the substrate, so that there is a stable interface between the gate dielectric layer and the substrate provided in the embodiments of the disclosure, thereby avoiding the impurities in the gate from diffusing into the substrate and affecting the performance of the device, while reducing the leakage current.

According to the method for preparing the memory provided in the embodiments of the disclosure, it can be achieved that the thickness of the gate dielectric layer between the active region and the gate in the control circuit is different from the thickness of the gate dielectric layer between the active region and the gate in the interface circuit, so that the performance of the device is more stable.

Figure 8L:
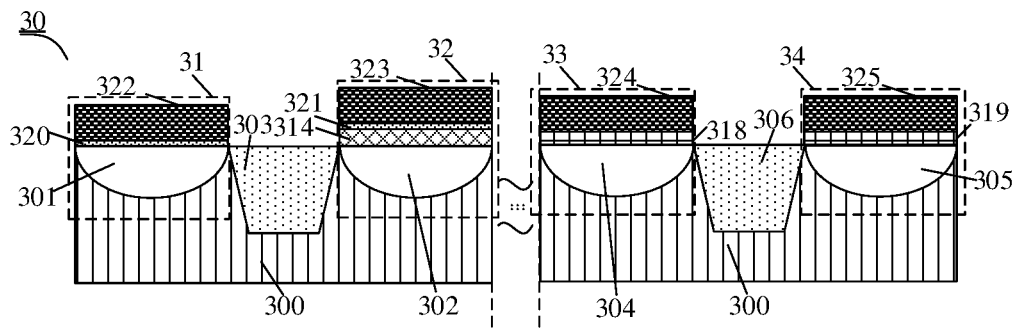

Hereinafter, referring to FIG. 8L, FIG. 8L is a schematic diagram showing formation of a gate according to an embodiment of the disclosure. As shown in FIG. 8L, S304 is performed, in which a first gate 322 covering the first gate dielectric layer 320 is formed to form a first NMOS device 31; a second gate 323 covering the second gate dielectric layer 321 is formed to form a first PMOS device 32; a third gate 324 covering the third gate dielectric layer 318 is formed to form a second NMOS device 33; and a fourth gate 325 covering the fourth gate dielectric layer 319 is formed to form a second PMOS device 34, so as to form the memory 30.

In the embodiments of the disclosure, the epitaxial layer covering the first P-type active region is formed on the substrate, and a gate dielectric layer with the same thickness is formed on the surface of each of the epitaxial layer and the first N-type active region. In this way, the thickness of the gate dielectric layer on the surface of the first P-type active region is the same as the thickness of the gate dielectric layer on the surface of the first N-type active region, so that the performance of the memory is more stable.

Figure 9:
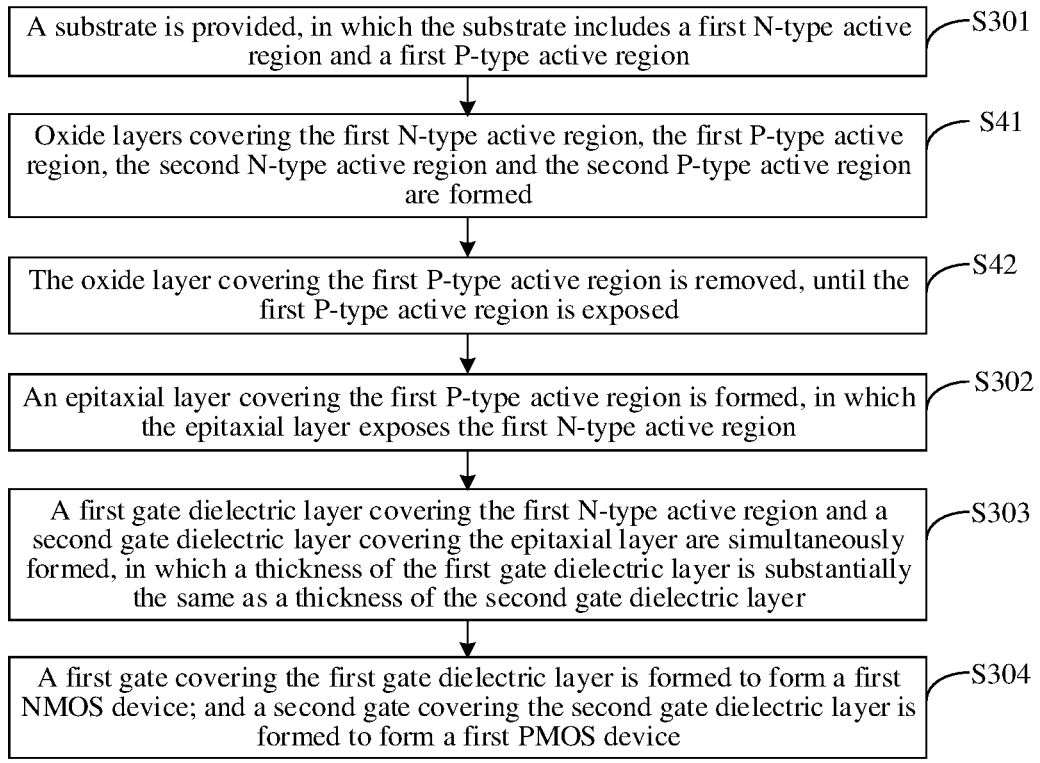
FIG. 9 is an optional schematic flowchart of a method for preparing a memory according to an embodiment of the disclosure.

In the foregoing embodiment, the third gate dielectric layer of the second NMOS device and the fourth gate dielectric layer of the second PMOS device are formed after the epitaxial layer is formed. However, in the other embodiments, the third gate dielectric layer of the second NMOS device and the fourth gate dielectric layer of the second PMOS device may also be formed before the epitaxial layer is formed. FIG. 9 is an optional schematic flowchart of a method for preparing a memory according to an embodiment of the disclosure. As shown in FIG. 9, the third gate dielectric layer of the second NMOS device and the fourth gate dielectric layer of the second PMOS device are formed before the epitaxial layer is formed, which may be implemented through the following operation.

In S41, oxide layers covering the first N-type active region, the first P-type active region, the second N-type active region and the second P-type active region are formed.

Figure 10A:
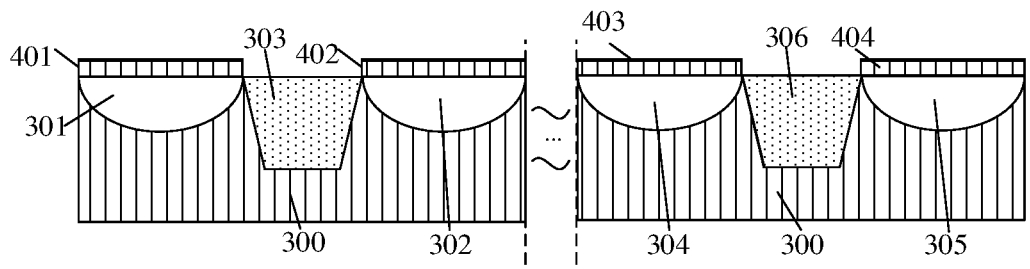
FIG. 10A to FIG. 10E are optional schematic diagrams of a method for preparing a memory according to an embodiment of the disclosure.

On the basis of the foregoing embodiments and FIG. 8A to FIG. 8L, FIG. 10A is a schematic diagram showing formation of a gate dielectric layer according to an embodiment of the disclosure. As shown in FIG. 10A, the oxide layer 401 covering the first N-type active region 301, the oxide layer 402 covering the first P-type active region 302, the oxide layer 403 covering the second N-type active region 304, and the oxide layer 404 covering the second P-type active region 305 are formed. The oxide layer covering the second N-type active region forms the third gate dielectric layer 403 of the second NMOS device, and the oxide layer covering the second P-type active region forms the fourth gate dielectric layer 404 of the second PMOS device.

In some embodiments, the gate dielectric layer may be formed through an in-situ thermal growth process, and a material of the gate dielectric layer may be a nitride (for example, silicon nitride or silicon oxynitride) or an oxide (for example, aluminum oxide or titanium oxide).

In S42, the oxide layer covering the first P-type active region is removed, until the first P-type active region is exposed.

Figure 10B:
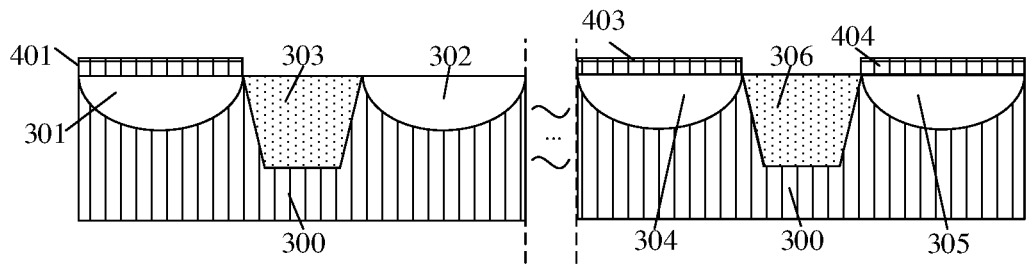
Figure 10C:
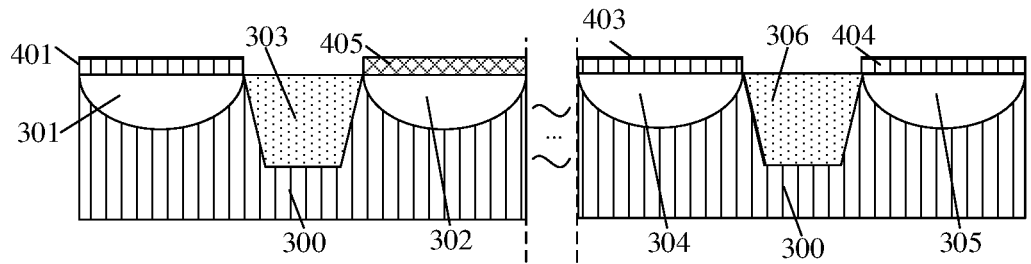

FIG. 10B is a schematic diagram showing removal of oxide layers according to an embodiment of the disclosure. As shown in FIG. 10B, photoresist layers (not shown in FIG. 10B) covering the oxide layer 401, the third gate dielectric layer 403 and the fourth gate dielectric layer 404 are formed. The oxide layer 402 is removed through a photolithography technology, until an upper surface of the first P-type active region 302 is exposed. And then the epitaxial layer 405 covering the first P-type active region 302 is formed. As shown in FIG. 10C, FIG. 10C is a schematic diagram showing formation of an epitaxial layer according to an embodiment of the disclosure. The operation and process for forming the epitaxial layer are the same as those described in the foregoing embodiments, which are not repeated in this embodiment of the disclosure.

Figure 10D:
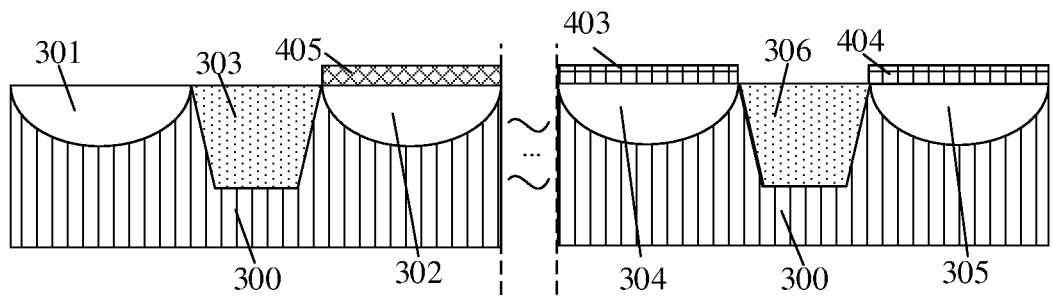

In some embodiments, after the oxide layer 402 is removed, the oxide layer 401 covering the first N-type active region is removed, until the upper surface of the first N-type active region 301 is exposed. As shown in FIG. 10D, FIG. 10D is a schematic diagram showing removal of oxide layers according to an embodiment of the disclosure.

Figure 10E:
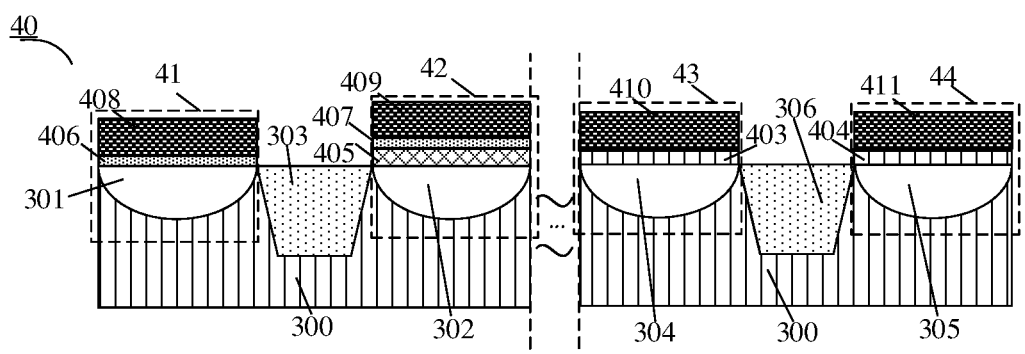

After the oxide layer covering the first N-type active region 301 is removed, the first gate dielectric layer 406 covering the first N-type active region and the second gate dielectric layer 407 covering the epitaxial layer are simultaneously formed. The first gate 408 covering the first gate dielectric layer is formed to form the first NMOS device 41; the second gate 409 covering the second gate dielectric layer is formed to form the first PMOS device 42; the third gate 410 covering the third gate dielectric layer is formed to form the second NMOS device 43; and the fourth gate 411 covering the fourth gate dielectric layer is formed to form the second PMOS device 44, so as to form the memory 40. As shown in FIG. 10E, FIG. 10E is an optional schematic diagram of a memory according to an embodiment of the disclosure. Herein, the method and process for forming the gate dielectric layers and the gates are the same as those described in the foregoing embodiments, which are not repeated in this embodiment of the disclosure.

Figure 13:
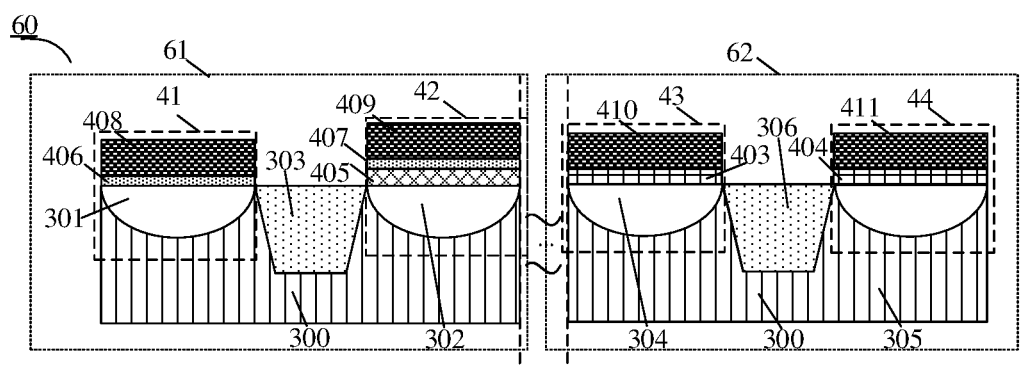
FIG. 13 is an optional schematic diagram of a memory according to an embodiment of the disclosure.

Hereinafter, referring to FIG. 13, on the basis of the foregoing embodiments and FIG. 10E, FIG. 13 is an optional schematic diagram of a memory according to an embodiment of the disclosure. As shown in FIG. 13, the memory 60 includes a storage array 61 and an interface circuit 62. The storage array 61 includes a plurality of first NMOS devices 41 and a plurality of first PMOS devices 42. The interface circuit 62 includes a plurality of second NMOS devices 43 and a plurality of second PMOS devices 44.

In the several embodiments provided in the disclosure, it should be understood that the disclosed device and method may be implemented in non-target manners. The described device embodiments are merely exemplary. For example, the unit division is merely logical function division and may be other division in an actual implementation. For example, a plurality of units or components may be combined or integrated into another system, or some features may be ignored or not performed. In addition, the displayed or discussed components may be coupled or directly coupled to each other.

The units described above as separate components may or may not be physically separated. Components presented as units may or may not be physical units, that is, may be located in one place or may be distributed over multiple network units. Part or all of these units may be selected according to practical requirements to achieve the objectives of the solutions of the embodiments.

The above descriptions are merely specific implementations of the embodiments of the disclosure, and are not intended to limit the protection scope of the embodiments of the disclosure. It is easy for those skilled in the art to convince modifications or substitutions within the technical scope disclosed in the embodiments of the disclosure. These modifications or substitutions are within the scope of the embodiments of the disclosure. Therefore, the protection scope of the embodiments of the disclosure is subject to the protection scope of the claims.

The invention claimed is:

1. A method for preparing a memory, comprising: providing a substrate, wherein the substrate comprises a first N-type active region and a first P-type active region; forming an epitaxial layer covering the first P-type active region, wherein the epitaxial layer exposes the first N-type active region; simultaneously forming a first gate dielectric layer covering the first N-type active region and a second gate dielectric layer covering the epitaxial layer, wherein a thickness of the first gate dielectric layer is same as a thickness of the second gate dielectric layer; and forming a first gate covering the first gate dielectric layer to form a first N-channel Metal Oxide Semiconductor (NMOS) device, and forming a second gate covering the second gate dielectric layer to form a first P-channel Metal Oxide Semiconductor (PMOS) device; wherein the epitaxial layer comprises at least a first sub-layer and a second sub-layer, and a constituent material of the epitaxial layer comprises silicon and germanium and wherein forming the epitaxial layer covering the first P-type active region comprises: forming the first sub-layer covering the first P-type active region; and forming the second sub-layer covering the first sub-layer, wherein a mass fraction of silicon in the second sub-layer is greater than or equal to a mass fraction of silicon in the first sub-layer; and wherein a mass fraction of germanium in the first sub-layer gradiently changes in a direction perpendicular to the substrate.

2. The method of claim 1, wherein the memory further comprises an interface circuit, the interface circuit comprises a second NMOS device and a second PMOS device, and a second N-type active region of the second NMOS device and a second P-type active region of the second PMOS device are arranged in the substrate;

wherein before forming the epitaxial layer, the method further comprises:

forming barrier layers covering the first N-type active region, the first P-type active region, the second N-type active region and the second P-type active region; and removing the barrier layer covering the first P-type active region, until the first P-type active region is exposed; and wherein forming the epitaxial layer covering the first P-type active region comprises:

forming the epitaxial layer after removing the barrier layer covering the first P-type active region.

3. The method of claim 2, wherein before forming the first gate dielectric layer and the second gate dielectric layer, the method further comprises:

removing the barrier layers covering the first N-type active region, the second N-type active region and the second P-type active region, after forming the epitaxial layer;

forming oxide layers covering the first N-type active region, the epitaxial layer, the second N-type active region and the second P-type active region, wherein the oxide layer covering the second N-type active region forms a third gate dielectric layer of the second NMOS device, and the oxide layer covering the second P-type active region forms a fourth gate dielectric layer of the second PMOS device; and removing the oxide layer covering the first N-type active region and the oxide layer covering the epitaxial layer, until the first N-type active region and the epitaxial layer are exposed.

4. The method of claim 3, wherein the oxide layer covering the epitaxial layer comprises a first portion and a second portion, and wherein forming the oxide layers covering the first N-type active region, the epitaxial layer, the second N-type active region and the second P-type active region comprises:
oxidizing a portion of the epitaxial layer to form the first portion of the oxide layer; and
forming the oxide layers covering the first N-type active region, the second N-type active region and the second P-type active region through a thermal oxidation process while forming the first portion, and forming the second portion, wherein the first portion is arranged between a remaining portion of the epitaxial layer and the second portion.

5. The method of claim 1, wherein the memory further comprises an interface circuit, the interface circuit comprises a second NMOS device and a second PMOS device, and a second N-type active region of the second NMOS device and a second P-type active region of the second PMOS device are arranged in the substrate;
wherein before forming the epitaxial layer, the method further comprises:
forming oxide layers covering the first N-type active region, the first P-type active region, the second N-type active region and the second P-type active region, wherein the oxide layer covering the second N-type active region forms a third gate dielectric layer of the second NMOS device, and the oxide layer covering the second P-type active region forms a fourth gate dielectric layer of the second PMOS device; and
removing the oxide layer covering the first P-type active region, until the first P-type active region is exposed; and
wherein before forming the first gate dielectric layer, the method further comprises: removing the oxide layer covering the first N-type active region, until the first N-type active region is exposed.

6. The method of claim 1, wherein a constituent material of the first sub-layer comprises silicon and germanium, and
wherein forming the first sub-layer covering the first P-type active region comprises:
supplying a first reaction gas containing silicon and a second reaction gas containing germanium to a surface of the substrate, so that the first reaction gas chemically reacts with the second reaction gas to form at least a portion of the first sub-layer; and
after supplying the first reaction gas and the second reaction gas for a first preset time period, decreasing a flow rate of the first reaction gas from a first flow rate to a second flow rate, and increasing a flow rate of the second reaction gas from a third flow rate to a fourth flow rate, to form the first sub-layer.

7. The method of claim 1, wherein a constituent material of the first sub-layer comprises silicon and germanium, and
wherein forming the first sub-layer covering the first P-type active region comprises:
supplying a first reaction gas containing silicon and a second reaction gas containing germanium to a surface of the substrate, so that the first reaction gas chemically reacts with the second reaction gas to form at least a portion of the first sub-layer; and
after supplying the first reaction gas and the second reaction gas for a first preset time period, decreasing a flow rate of the first reaction gas from a first flow rate to a second flow rate.

8. The method of claim 1, wherein a constituent material of the first sub-layer comprises silicon and germanium, and wherein forming the first sub-layer covering the first P-type active region comprises:
supplying a first reaction gas containing silicon and a second reaction gas containing germanium to a surface of the substrate, so that the first reaction gas chemically reacts with the second reaction gas to form at least a portion of the first sub-layer; and
after supplying the first reaction gas and the second reaction gas for a first preset time period, increasing a flow rate of the second reaction gas from a third flow rate to a fourth flow rate, to form the first sub-layer.

9. The method of claim 1, wherein the first sub-layer comprises a first silicon layer and a silicon germanium layer, and
wherein forming the first sub-layer covering the first P-type active region comprises:
supplying a first reaction gas containing silicon to a surface of the substrate to form the first silicon layer covering the first P-type active region; and
supplying the first reaction gas and a second reaction gas containing germanium to the surface of the substrate after forming the first silicon layer, so that the first reaction gas chemically reacts with the second reaction gas to form the silicon germanium layer covering the first silicon layer.

10. The method of claim 1, wherein a surface of the second sub-layer away from the substrate is a second silicon layer.

11. A memory, the memory comprising at least a substrate and a control circuit, the control circuit comprising: a first N-channel Metal Oxide Semiconductor (NMOS) device comprising a first N-type active region, a first gate dielectric layer and a first gate, wherein the first N-type active region is arranged in the substrate, and the first gate dielectric layer is arranged between the first N-type active region and the first gate; and a first P-channel Metal Oxide Semiconductor (PMOS) device comprising a first P-type active region, an epitaxial layer, a second gate dielectric layer and a second gate, wherein the first P-type active region is arranged in the substrate, the epitaxial layer is arranged between the first P-type active region and the second gate dielectric layer, and a thickness of the second gate dielectric layer is same as a thickness of the first gate dielectric layer; wherein a constituent material of the epitaxial layer comprises silicon and germanium, and the epitaxial layer comprises: a first sub-layer and a second sub-layer, wherein the first sub-layer is arranged between the second sub-layer and the first P-type active region, and a mass fraction of silicon in the second sub-layer is greater than or equal to a mass fraction of silicon in the first sub-layer; and wherein a mass fraction of germanium in the first sub-layer gradiently changes in a direction perpendicular to the substrate.

12. The memory of claim 11, wherein the first sub-layer comprises:
a first silicon layer and a silicon germanium layer, wherein the silicon germanium layer is arranged between the first silicon layer and the second sub-layer.

13. The memory of claim 11, wherein a surface of the second sub-layer away from the substrate is a second silicon layer.

14. The memory of claim 11, further comprising:
a storage array arranged on the substrate; and
an interface circuit comprising a second NMOS device and a second PMOS device,
wherein the second NMOS device comprises a second N-type active region, a third gate dielectric layer and a third gate, the second N-type active region is arranged in the substrate, the third gate dielectric layer is arranged between the second N-type active region and the third gate, and a thickness of the third gate dielectric layer is greater than the thickness of the first gate dielectric layer; and wherein the second PMOS device comprises a second P-type active region, a fourth gate dielectric layer and a fourth gate, the second P-type active region is arranged in the substrate, the fourth gate dielectric layer is arranged between the second P-type active region and the fourth gate, a thickness of the fourth gate dielectric layer is substantially the same as the thickness of the third gate dielectric layer, and the thickness of the fourth gate dielectric layer is greater than the thickness of the second gate dielectric layer.

* * * * *